United States Patent
Lensing

(10) Patent No.: US 6,707,562 B1
(45) Date of Patent: Mar. 16, 2004

(54) METHOD OF USING SCATTEROMETRY MEASUREMENTS TO CONTROL PHOTORESIST ETCH PROCESS

(75) Inventor: Kevin R. Lensing, Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 0 days.

(21) Appl. No.: 09/897,205

(22) Filed: Jul. 2, 2001

(51) Int. Cl.$^7$ ............................................. G01B 11/28
(52) U.S. Cl. ..................... 356/630; 356/601; 356/625; 356/636
(58) Field of Search ................. 356/625, 636, 356/601, 630

(56) References Cited

U.S. PATENT DOCUMENTS

| | | | |
|---|---|---|---|
| 5,629,772 A | 5/1997 | Ausschnitt | 356/372 |
| 5,655,110 A | 8/1997 | Krivokapic et al. | 395/500 |
| 5,773,174 A | 6/1998 | Koizumi et al. | 430/30 |
| 5,867,276 A | 2/1999 | McNeil et al. | 356/445 |
| 5,877,860 A | 3/1999 | Borden | 356/376 |

(List continued on next page.)

OTHER PUBLICATIONS

Hankinson et al., "Integrated Real–time and Run–to–Run Control of Etch Depth in Reactive Ion Etching," Mar. 13, 1996, pp. 1–17.

(List continued on next page.)

Primary Examiner—Thien M. Le
Assistant Examiner—Kumiko C. Koyama
(74) Attorney, Agent, or Firm—Williams, Morgan & Amerson, P.C.

(57) ABSTRACT

The present invention is generally directed to a method of using scatterometry measurements to control the photoresist etch process. In one embodiment, the method comprises forming at least one grating structure in a layer of photoresist material, the grating structure being comprised of a plurality of photoresist features of a first size, and performing an etching process on the photoresist features of the grating structure to reduce the photoresist features to a second size that is less than the first size. The method further comprises illuminating the grating structure, measuring a phase and intensity of spectroscopic light reflected off of the grating structure after the etching process is started to generate an optical characteristic trace for the grating structure, comparing the generated optical characteristic trace to a target optical characteristic trace that corresponds to a grating structure comprised of a plurality of photoresist features having a desired profile, and stopping the etching process based upon the comparison of the generated trace and the target trace.

80 Claims, 3 Drawing Sheets

U.S. PATENT DOCUMENTS

| | | | |
|---|---|---|---|
| 5,880,838 A | | 3/1999 | Marx et al. .................. 356/351 |
| 5,923,423 A | * | 7/1999 | Sawatari et al. ............. 356/484 |
| 5,926,690 A | | 7/1999 | Toprac et al. .................. 438/17 |
| 5,955,654 A | * | 9/1999 | Stover et al. ................. 73/1.89 |
| 6,051,348 A | | 4/2000 | Marinaro et al. ............. 430/30 |
| 6,081,334 A | | 6/2000 | Grimbergen et al. ........ 356/357 |
| 6,245,584 B1 | | 6/2001 | Marinaro et al. ............. 438/14 |
| 6,259,521 B1 | * | 7/2001 | Miller et al. ............. 356/237.5 |
| 6,383,824 B1 | * | 5/2002 | Lensing ........................ 438/14 |
| 6,433,878 B1 | | 8/2002 | Niu et al. .................... 356/603 |
| 6,479,200 B1 | * | 11/2002 | Stirton ......................... 430/30 |
| 2002/0135781 A1 | | 9/2002 | Singh et al. ................. 356/601 |

OTHER PUBLICATIONS

Boning et al., "Practical Issues in Run by Run Process Control," 1995 IEEE/SEMI Advanced Manufacturing Conference, 1995, pp. 201–208.

Zafiriou et al., "Nonlinear Model Based Run–to–Run Control for Rapid Thermal Processing with Unmeasured Variable Estimation," 187$^{th}$ ECS Meeting, Reno, NV, May 1995.

Boning et al., "Run by Run Control of Chemical–Mechanical Polishing," IEEE/CHMT International Electronics Manufacturing Technology Symposium, Austin, TX, Oct. 2–4, 1995.

Smith et al., "Compensating for CMP Pad Wear Using Run by Run Feedback Control," VMIC, Santa Clara, CA, Jun. 18–20, 1996.

Sachs et al., "Process Control System for VLSI Fabrication," IEEE Transactions on Semiconductor Manufacturing, Apr. 5, 1990, pp. 1–31.

* cited by examiner

METHOD OF USING SCATTEROMETRY MEASUREMENTS TO CONTROL PHOTORESIST ETCH PROCESS

BACKGROUND OF THE INVENTION

1. Field of the Invention

This invention relates generally to semiconductor fabrication technology, and, more particularly, to a method of using scatterometry measurements to control photoresist etch process, and a system for accomplishing same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

Typically, integrated circuit devices are comprised of hundreds or millions of transistors formed above a semiconducting substrate. By way of background, an illustrative field effect transistor 10, as shown in FIG. 1, may be formed above a surface 15 of a semiconducting substrate or wafer 11 comprised of doped-silicon. The substrate 11 may be doped with either N-type or P-type dopant materials. The transistor 10 may have a doped polycrystalline silicon (polysilicon) gate electrode 14 formed above a gate insulation layer 16. The gate electrode 14 and the gate insulation layer 16 may be separated from doped source/drain regions 22 of the transistor 10 by a dielectric sidewall spacer 20. The source/drain regions 22 for the transistor 10 may be formed by performing one or more ion implantation processes to introduce dopant atoms, e.g., arsenic or phosphorous for NMOS devices, boron for PMOS devices, into the substrate 11. Shallow trench isolation regions 18 may be provided to isolate the transistor 10 electrically from neighboring semiconductor devices, such as other transistors (not shown). Additionally, although not depicted in FIG. 1, a typical integrated circuit device is comprised of a plurality of conductive interconnections, such as conductive lines and conductive contacts or vias, positioned in multiple layers of insulating material formed above the substrate 11.

One illustrative process flow for forming the gate electrode 14 will now be described. As shown in FIG. 2, a process layer 17 comprised of a gate insulation material, e.g., silicon dioxide, is formed above the semiconducting substrate 11. Typically, this is accomplished by an oxidation process. Then, a process layer 19 comprised of a gate electrode material is formed above the process layer 17. Typically, the process layer 19 is comprised of polysilicon, and it may be formed by a variety of processes, e.g., by a chemical vapor deposition ("CVD") process. If desired, an anti-reflective coating layer (not shown) may also be formed above the process layer 19 to reduce reflections during subsequent photolithography exposure processes. The anti-reflective coating layer may be comprised of a variety of materials, e.g., silicon nitride, silicon oxynitride, etc. Also depicted in FIG. 2 is a photoresist feature 21. The photoresist feature 21 is part of a patterned layer (not shown) of photoresist material (positive or negative) formed above the process layer 19 using known photolithography techniques. Millions of such photoresist features 21 are formed in a patterned layer of photoresist.

After the photoresist feature 21 is formed, one or more etching processes will be performed to form a gate electrode structure 14 from the underlying process layer 19. In one process flow, prior to etching the process layer 19, the photoresist feature 21 will be subjected to a photoresist etch or trim process to initially reduce the size of the photoresist feature 21 to the size indicated by dashed lines 23. This results in a reduced size photoresist feature 21A. This photoresist trimming process may be accomplished by a variety of techniques. For example, oxygen ($O_2$) may be introduced into the etch chamber to reduce the size of the original photoresist feature 21 to that depicted for the reduced size photoresist feature 21A.

The reduced size photoresist features 21A has a critical dimension 24 that is less than that of the initially formed photoresist feature 21. Through use of this photoresist trim technique, the critical dimension of photoresist features may be reduced to a size smaller than that which may be directly patterned in a layer of photoresist using known photolithography tools. For example, using current photolithography tools and techniques, feature sizes on the order of 0.18 $\mu$m may be formed. Of course, efforts are continually being made to improve photolithography tools such that smaller and smaller feature sizes may be formed. Nevertheless, as will be understood after a complete reading of the present application, the present invention may be employed as the performance of photolithography equipment continues to improve.

After the photoresist trim process is performed, one or more etching processes are performed to etch the desired feature in the underlying process layer, e.g., a gate electrode 14 in the process layer 19. For example, an initial anisotropic etching process may be performed to etch through approximately 75% of the process layer 19. Thereafter, an isotropic etching process may be performed on the remaining portion of the process layer 19 to insure the integrity of the underlying process layer 17. The gate electrode structure (not shown) formed using this technique would have sidewalls defined by the dashed lines 25.

One problem encountered with the present photoresist trim process is that there is no direct control employed in determining when to stop the photoresist trim process. That is, typically the photoresist trim process is performed, and gate electrode structures 14 are formed in the underlying process layer 19. Thereafter, the critical dimensions of one or more of the resulting gate electrode structures 14 is measured. If the measured gate electrode structures 14 have a critical dimension greater than a target value, then the duration of the photoresist trimming process is increased for subsequently processed wafers. Conversely, if the measured gate electrodes 14 have a critical dimension less than a target value, then the duration of the photoresist process is decreased on subsequently processed wafers. While such control techniques tend to work, a more direct method of controlling the photoresist trim process is desired.

The present invention is directed to a method and system that may solve, or at least reduce, some or all of the aforementioned problems.

SUMMARY OF THE INVENTION

The present invention is generally directed to a method of using scatterometry measurements to control the photoresist etch process, and a system for accomplishing same. In one embodiment, the method comprises forming at least one grating structure in a layer of photoresist material, the grating structure being comprised of a plurality of photoresist features of a first size, and performing an etching process on the photoresist features of the grating structure to reduce the photoresist features to a second size that is less than the first size. The method further comprises illuminating the grating structure, measuring light reflected off of the grating structure after the etching process is started to generate an optical characteristic trace for the grating structure, comparing the generated optical characteristic trace to a target optical characteristic trace that corresponds to a grating structure comprised of a plurality of photoresist features having a desired profile, and stopping the etching process based upon the comparison of the generated trace and the target trace.

In another illustrative embodiment, the method comprises forming a process layer above a semiconducting substrate, forming a layer of photoresist material above the process layer, and forming a plurality of photoresist features in the layer of photoresist material, a first group of the photoresist features comprising at least one grating structure, the photoresist features being of a first size. The method further comprises performing an etching process on the plurality of photoresist features to reduce the photoresist features to a second size, the second size being less than the first size, illuminating the grating structure, measuring light reflected off of the grating structure after the etching process is started to generate an optical characteristic trace for the grating structure, comparing the generated optical characteristic trace to a target optical characteristic trace that corresponds to a grating structure comprised of a plurality of photoresist features having a desired profile, and stopping the etching process based upon the comparison of the generated trace and the target trace.

BRIEF DESCRIPTION OF THE DRAWINGS

The invention may be understood by reference to the following description taken in conjunction with the accompanying drawings, in which like reference numerals identify like elements, and in which.

Figure 1:
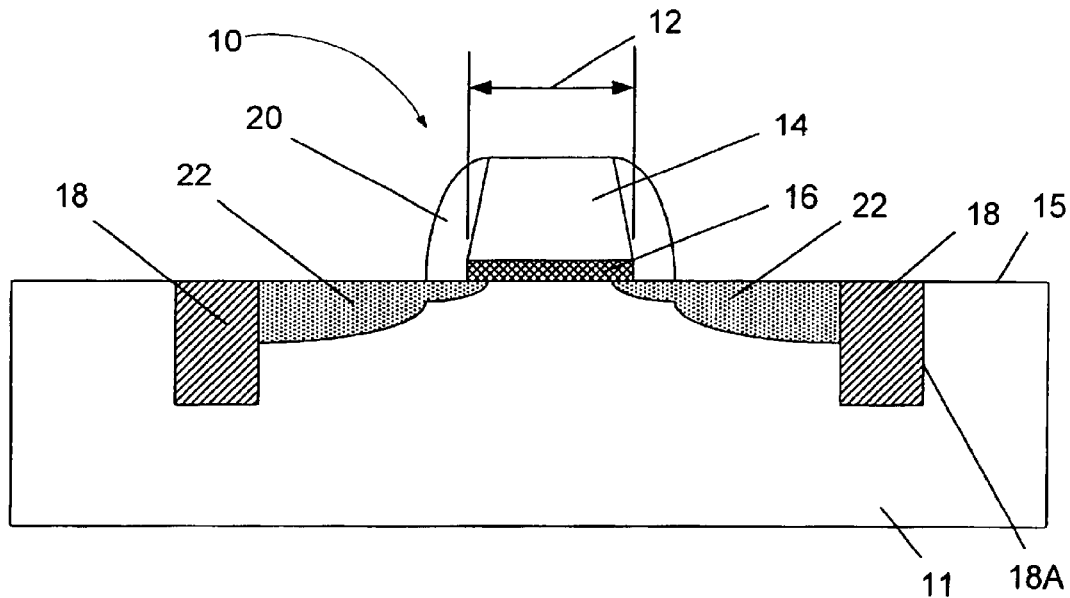
FIG. 1 is a cross-sectional view of an illustrative prior art transistor.
Figure 2:
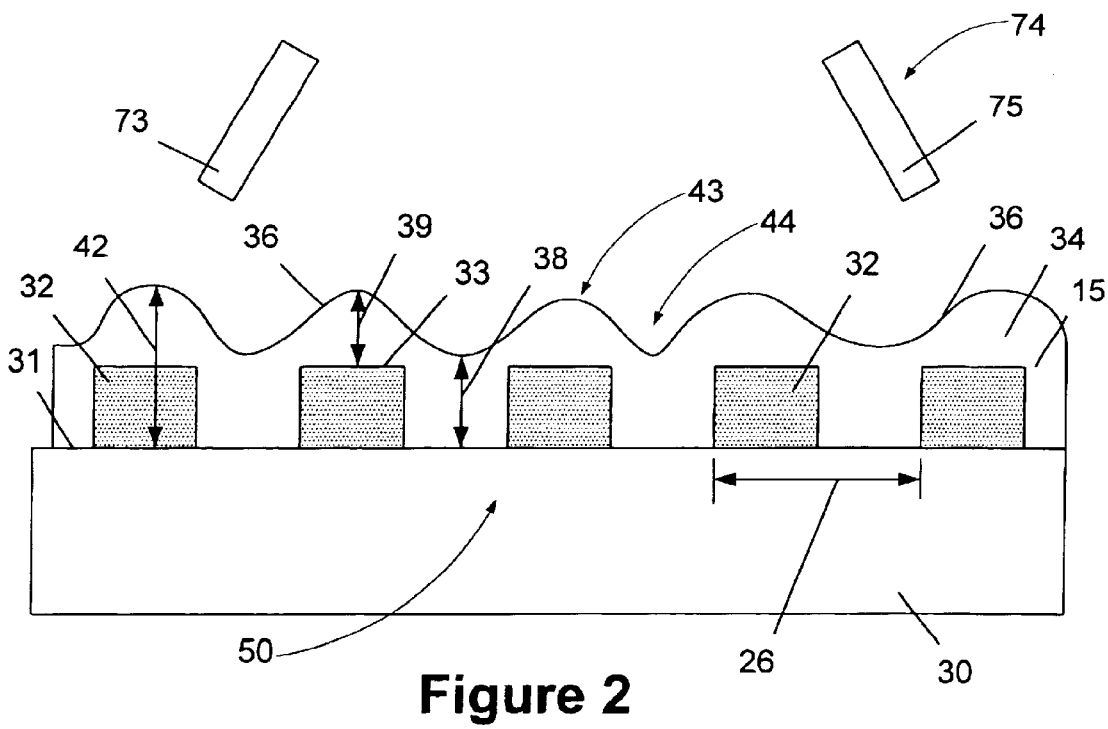
FIG. 2 is a cross-sectional view of a plurality of process layers having a photoresist feature formed thereabove.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention.

In general, the present invention is directed to a method of using scatterometry measurements to control a photoresist etch process, and a system for accomplishing same. As will be readily apparent to those skilled in the art upon a complete reading of the present application, the present method is applicable to a variety of technologies, e.g., NMOS, PMOS, CMOS, etc., and it is readily applicable to a variety of devices, including, but not limited to, logic devices, memory devices, etc.

Semiconductor manufacturing generally involves multiple processes whereby multiple layers of material are formed above a semiconducting substrate, and portions of those layers are selectively removed until such time as a completed device is formed. In general, photolithography involves the process of forming a layer of photoresist material above one or more process layers in which a feature, e.g., a metal line, a gate electrode, an opening in a layer of insulating material, will be formed. Thereafter, a pattern that is desired to be transferred into the underlying process layer or layers will be formed in the layer of photoresist material. Then, using one or more etching processes, the underlying process layer is etched using the patterned layer of photoresist as a mask, thereby resulting in a patterned process layer that replicates the pattern formed in the layer of photoresist.

Figure 3:
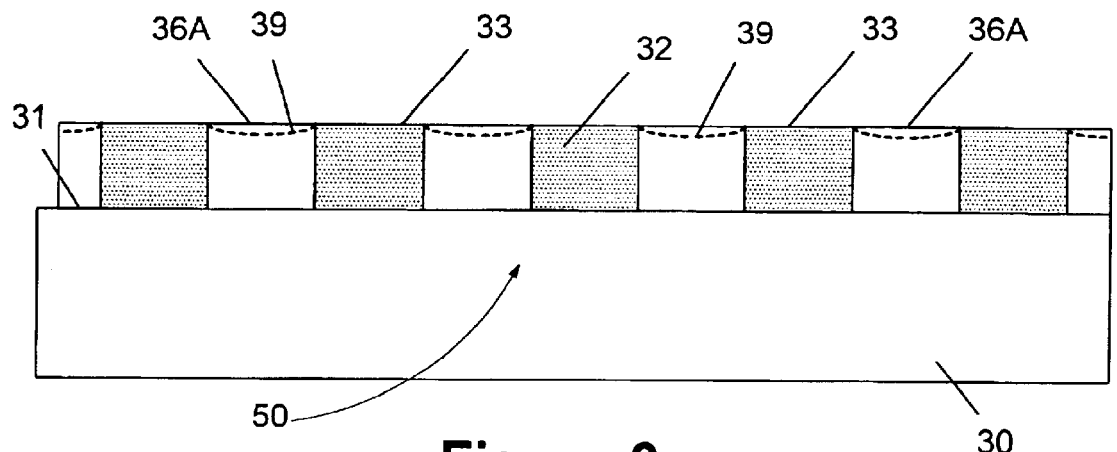
FIG. 3 is a cross-sectional view of a grating structure comprised of a plurality of photoresist features being measured using a scatterometry tool.

As shown in FIG. 3, a process layer 30 comprised of a gate insulation material, a process layer 32 comprised of a gate electrode material, and an anti-reflective coating layer 34 are formed above a semiconducting substrate 11. Also depicted in FIG. 3 are a plurality of photoresist features 36, as indicated by the solid lines 37. The photoresist features 36 are part of a patterned layer of photoresist formed above the anti-reflective coating layer 34. The plurality of photoresist features 36 define a grating structure 50 that will be measured using a scatterometry tool 74 comprised of an illustrative light source 73 and collector 75.

The various layers depicted in FIG. 3 may be comprised of a variety of materials that are formed to a variety of thicknesses using a variety of production techniques. For example, the process layer 30 may be comprised of silicon dioxide, it may have a thickness ranging from approximately 1.5–5 nm, and it may be formed by an oxidation process. Similarly, the process layer 32 may be comprised of polysilicon, and it may be formed by a chemical vapor deposition process to a thickness ranging from approximately 150–400 nm. The anti-reflective coating layer 34, if used, may be comprised of silicon oxynitride, and it may be formed by a deposition process to a thickness ranging from approximately 20–100 nm. The layer of photoresist (not shown) from which the photoresist features 36 will be formed, may be formed by a variety of spin coating processes to a thickness of approximately 400–1000 nm.

The photoresist features 36 may be formed by a variety of known photolithography techniques. For example, the layer of photoresist (not shown) may be subjected to an exposure process in a stepper tool of a photolithography module, and the exposed layer of photoresist may be subjected to a development process whereby soluble portions of the layer of photoresist are removed. This process will result in the formation of millions of such photoresist features 36 above the substrate. The photoresist features 36 have slightly tapered sidewalls 37 due to the inherent nature of the photolithography process. Of course, the profile of the photoresist features 36 may vary depending upon numerous factors that may vary during the exposure process, e.g., location of focal plane, photoresist thickness, wafer tilt, etc. Using present-day photolithographic tools and processes, the features 36 may have a critical dimension of approximately 0.18 $\mu$m. Of course, as will become clear after a complete reading of the present application, the present invention may be used as photolithographic tools and processes continue to be improved.

Figure 4:
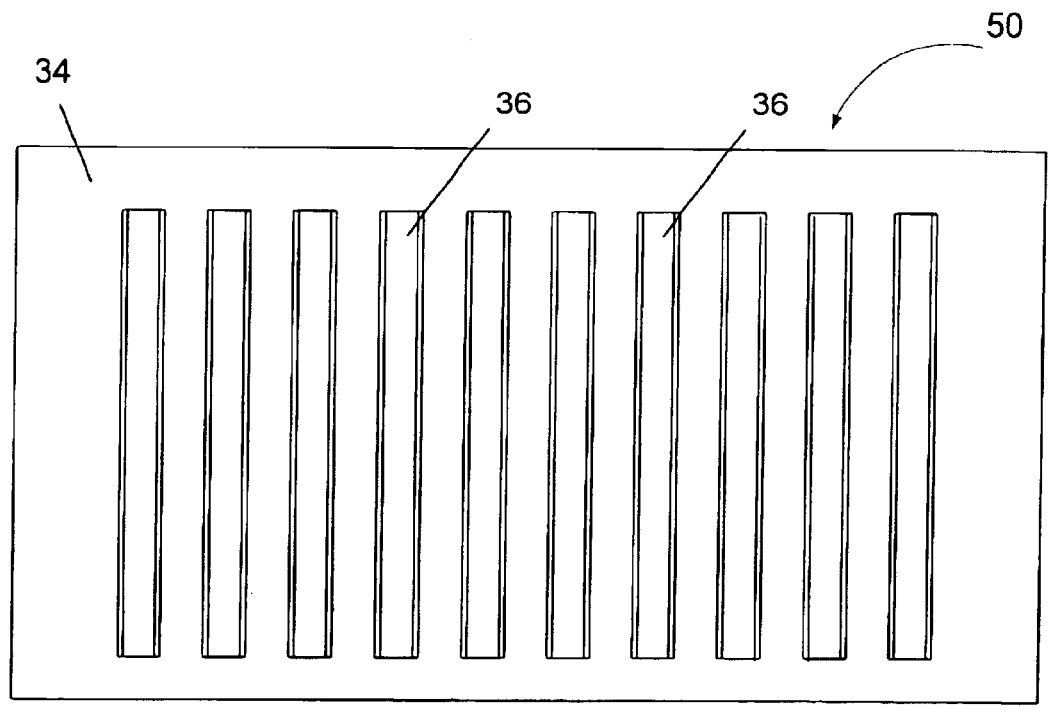
FIG. 4 is a plan view of the illustrative grating structure depicted in FIG. 3.

As shown in FIGS. 3 and 4, the present invention involves the formation of a plurality of photoresist features 36 to define a grating structure 50. The photoresist features 36 have a critical dimension 41. The photoresist features 36 comprising the grating structure 50 may have a pitch 26 that varies from approximately 400–1000 nm. A plurality of such grating structures 50 may be formed at various locations across the surface of the substrate 11. The grating structure 50 may be a separate test structure, or in some embodiments, it may be comprised of photoresist features 36 that are used to form actual production devices. For example, the grating structure 50 may be essentially a test structure that is formed in an area defined by a scribe line of a wafer 11. The photoresist features 36 that are part of the grating structure 50 may be formed at the same time that similar photoresist features 36 are being formed for production devices formed on the wafer 11.

Depending upon the type of integrated circuit device under consideration, and/or as a matter of design choice, the grating structure(s) 50 may be comprised of photoresist features 36 that are used to form actual production integrated circuit devices. For example, for memory devices, the photoresist features 36 comprising the grating structure 50 may be used in producing gate electrode type structures that are part of the completed memory device. The size, shape and configuration of the grating structure 50 may be varied as a matter of design choice. For example, the grating structure 50 may be formed in an area having approximate dimensions of 100 $\mu$m×120 $\mu$m, and it may be comprised of approximately 500–1500 photoresist features 36 (depending upon the selected pitch).

Also depicted in FIG. 3 is an illustrative scatterometry tool 74 comprised of a representative light source 73 and a detector 75. Ultimately, the grating structure 50 will be measured using scatterometric techniques, and these measurements will be used to determine and/or confirm the endpoint of the photoresist etch or trim process performed on the photoresist features 36 across the surface of the wafer 11.

Figure 5:
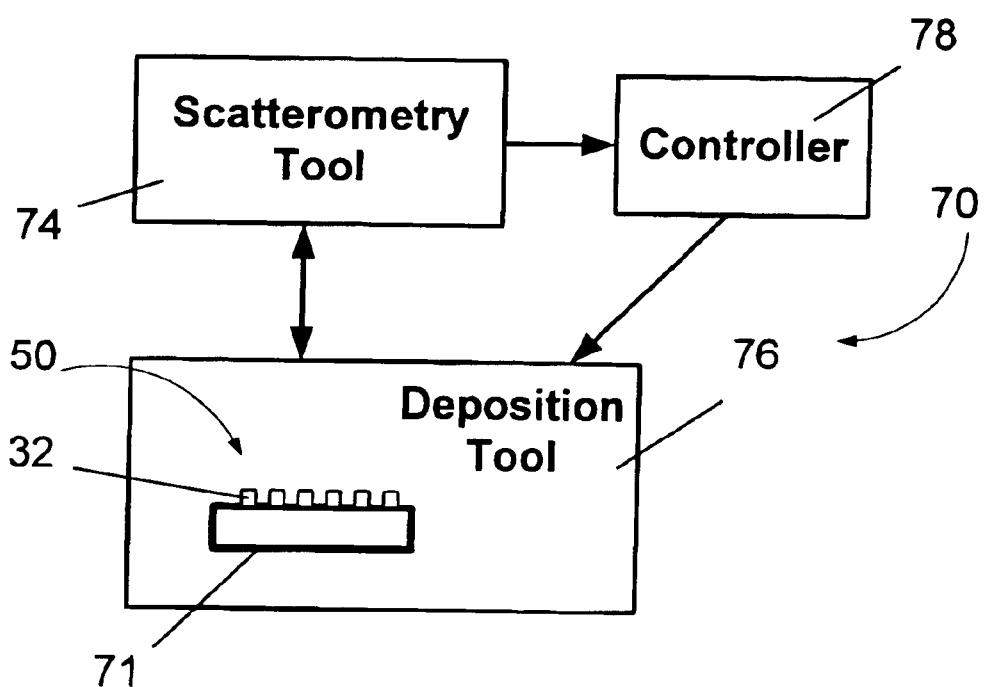
FIG. 5 depicts a system in accordance with one illustrative embodiment of the present invention.

An illustrative system 70 that may be used in one embodiment of the present invention is shown in FIG. 5. The system 70 is comprised of a scatterometry tool 74, an etch tool 76, and a controller 78. An illustrative wafer 71 is also depicted in FIG. 5. The wafer 71 is representative of wafers processed to the point where a patterned layer of photoresist, comprised of a plurality of photoresist features 36, has been formed thereabove using traditional photolithography techniques. At least one grating structure 50 comprised of a plurality of photoresist features 36 has also been formed above the wafer 11. The wafer 71 is depicted at the point where photoresist trimming or etching processes will be performed on the patterned layer of photoresist in the etch tool 76.

A variety of scatterometry tools 74 may be used with the present invention, e.g., so-called 2θ-type systems and lens-type scatterometry tools. The scatterometry tool 74 may use white light, or some other wavelength or combination of wavelengths, depending on the specific implementation. Typically, the scatterometry tool 74 will generate an incident beam that has a wide spectral composition and wherein the intensity of the light changes slowly in comparison to changes in wavelength. The angle of incidence of the light may also vary, depending on the specific implementation. The profile traces generated by the scatterometry tool 74 may be based upon a comparison of reflected light intensity and phase to wavelength (for white light, fixed angle type scatterometry tools) or a comparison of intensity to reflected angle (for angle resolved systems that use a single light source).

After the photoresist features 36 are formed, an initial photoresist trimming process is performed in the etch tool 76. During this process, the photoresist features 36 are reduced to the size indicated by the dashed lines 38 in FIG. 3. This results in the definition of a reduced size photoresist feature 36A. The reduced size photoresist feature 36A has a critical dimension 42 that is less than the critical dimension 41 of the initially formed photoresist features 42. This photoresist trimming process may be an approximately isotropic process. For example, in one embodiment, this photoresist trimming process is accomplished by introducing approximately 10–20 sccm of oxygen into the etch tool or chamber 76 for a duration of approximately 10–40 seconds.

In one embodiment, the present invention is directed to the use of scatterometric techniques to endpoint the photoresist trim process. That is, after the photoresist trim process is started, a scatterometry tool 74 is used to obtain an optical characteristic trace of the grating structure 50 comprised of a plurality of photoresist features 36 at various times as the photoresist features 36 are being reduced in size. The measured or generated optical characteristic trace for the grating structure 50 is compared to a pre-established or target optical characteristic trace that has been calculated using Maxwell's equations for a reduced size photoresist feature 36A having a desired target profile or characteristic, e.g., critical dimension. This target profile of the reduced size photoresist feature 36A is one that produces features, e.g., gate electrode structures, of an acceptable size in the underlying process layers, e.g., layer 32. This target optical characteristic trace may be stored in a library in the scatterometry tool 74.

The scatterometry tool 74 is used to measure or generate an optical characteristic trace of the photoresist feature 36 after the photoresist trim process has been started. The frequency of the measurements taken by the scatterometry tool 74 may be varied as a matter of design choice. For example, during a typical photoresist trim process, the scatterometry tool 74 may generate an optical characteristic trace for the grating structure 50 approximately every 2 seconds. Measurements may also be taken at different rates during the duration of the photoresist etch process, i.e., measurements may be taken as the process nears endpoint. The optical characteristic trace generated by the scatterometry tool 74 may then be compared to the target optical characteristic trace. This comparison may be made within the scatterometry tool 74, or it may be made by the controller 78, or it may be made by some other controller within the manufacturing facility. Through use of this technique, the target optical characteristic trace may be used to endpoint the photoresist trim or etch process when the measured optical characteristic trace of the grating structure 50 closely approximates or matches the target trace. More particularly, when it is determined that the measured trace matches or closely approximates the target trace, the controller 78 may stop the photoresist trim or etch process performed in the etch tool 74. As a result, the process of forming features in a process layer may be more precisely controlled. This results in the production of more integrated circuit devices within acceptable tolerance levels. Accordingly, manufacturing efficiencies may be improved.

The optical measurements of the grating structure 50 may be performed on any desired number of grating structures 50 and wafers. For example, such measurements may be performed on all wafers in one or more lots, or on a representative number of wafers in a given lot. A single substrate 11 may contain a plurality of grating structures 50, and they may be spaced out above the surface of the substrate 11. Any number of such grating structures may be measured. In one embodiment, the controller 78 may obtain data or information regarding a few initial wafers in a lot, then the average resist trim time from those initial wafers may be applied to the remainder of the lot.

In the illustrated embodiments, the controller 78 is a computer programmed with software to implement the functions described herein. Moreover, the functions described for the controller 78 may be performed by one or more controllers spread through the system. For example, the controller 78 may be a fab level controller that is used to control processing operations throughout all or a portion of a semiconductor manufacturing facility. Alternatively, the controller 78 may be a lower level computer that controls only portions or cells of the manufacturing facility. Moreover, the controller 78 may be a stand-alone device, or it may reside on the etch tool 76. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 78, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699-Provisional Specification for CIM Framework Domain Architecture) and APC (SEMI E93-0999-Provisional Specification for CIM Framework Advanced Process Control Component) specifications are publicly available from SEMI. In some embodiments, system software, such as the Catalyst system referenced above, may not be used in implementing the present invention.

The present invention is generally directed to a method of using scatterometry measurements to control the photoresist etch process, and a system for accomplishing same. In one embodiment, the method comprises forming at least one grating structure 50 in a layer of photoresist material, the grating structure 50 being comprised of a plurality of photoresist features 36 of a first size, and performing an etching process on the photoresist features 36 of the grating structure 50 to reduce the photoresist features to a second size that is less than the first size. The method further comprises illuminating the grating structure 50, measuring a phase and intensity of spectroscopic light reflected off of the grating structure 50 after the etching process is started to generate an optical characteristic trace for the grating structure 50, comparing the generated optical characteristic trace to a target optical characteristic trace that corresponds to a grating structure 50 comprised of a plurality of photoresist features having a desired profile, and stopping the etching process based upon the comparison of the generated trace and the target trace.

In another illustrative embodiment, the method comprises forming a process layer 32 above a semiconducting substrate, forming a layer of photoresist material above the process layer 32, and forming a plurality of photoresist features 36 in the layer of photoresist material, a first group of the photoresist features 36 comprising at least one grating structure 50, the photoresist features being of a first size. The method further comprises performing an etching process on the plurality of photoresist features 36 to reduce the photoresist features to a second size, the second size being less than the first size, illuminating the grating structure 50, measuring a phase and intensity of spectroscopic light reflected off of the grating structure 50 after the etching process is started to generate an optical characteristic trace for the grating structure 50, comparing the generated optical characteristic trace to a target optical characteristic trace that corresponds to a grating structure 50 comprised of a plurality of photoresist features having a desired profile, and stopping the etching process based upon the comparison of the generated trace and the target trace.

The present invention is also directed to a system 70 capable of performing the inventive methods described herein. In one embodiment, the system is comprised of an etch tool 76, a scatterometry tool 74 and a controller 78. The etch tool 76 is adapted for performing an etching process on a grating structure 50 comprised of a plurality of photoresist features. The scatterometry tool 74 is adapted to illuminate the grating structure 50 and measure light reflected off of the grating structure 50 after the photoresist etching process is started to generate an optical characteristic trace for the grating structure 50. The scatterometry tool 74 then compares the generated optical characteristic trace to a target optical characteristic trace established for a grating structure comprised of a plurality of photoresist features having a desired profile. The controller 78 stops the photoresist etch process based upon a comparison of the measured trace and the target trace. In a more particular embodiment, the controller 78 stops the photoresist etch process when the measured optical characteristic trace closely approximates the target trace.

Through use of the present invention, better process control may be achieved in modem integrated circuit manufacturing facilities. For example, the present invention may enable more precise formation of gate electrode structures of transistors employed in integrated circuit devices, thereby improving device performance and increasing production yields. Of course, the present invention may also be used in forming other types of structures used in modem integrated circuit devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming at least one grating structure in a layer of photoresist material, said grating structure being comprised of a plurality of photoresist features of a first size;
    performing an etching process on said photoresist features of said at least one grating structure to reduce said photoresist features to a second size that is less than said first size;
    illuminating the at least one grating structure;
    measuring light reflected off of said grating structure after said etching process is started to generate an optical characteristic trace for said grating structure;
    comparing said generated optical characteristic trace to a target optical characteristic trace that corresponds to a grating structure comprised of a plurality of photoresist features having a desired profile; and
    stopping said etching process based upon said comparison of said generated trace and said target trace.

2. The method of claim 1, wherein forming at least one grating structure in a layer of photoresist material, said grating structure being comprised of a plurality of photoresist features of a first size, comprises forming at least one grating structure in a layer of photoresist material above a scribe line of a wafer, said grating structure being comprised of a plurality of photoresist features of a first size.

3. The method of claim 1, wherein forming at least one grating structure in a layer of photoresist material, said grating structure being comprised of a plurality of photoresist features of a first size, comprises forming at least one grating structure in a layer of photoresist material above a production die of a wafer, said grating structure being comprised of a plurality of photoresist features of a first size.

4. The method of claim 1, wherein each of said grating structures occupies an area of approximately 100 $\mu$m×120 $\mu$m.

5. The method of claim 1, wherein said plurality of photoresist features comprising said at least one grating structure have a pitch ranging from approximately 400–1000 nm.

6. The method of claim 1, wherein performing an etching process on said photoresist features of said at least one grating structure to reduce said photoresist features to a second size that is less than said first size comprises performing an etching process on said photoresist features of said at least one grating structure using oxygen as an etchant gas to reduce said photoresist features to a second size that is less than said first size.

7. The method of claim 1, wherein performing an etching process on said photoresist features of said at least one grating structure to reduce said photoresist features to a second size that is less than said first size comprises performing an etching process on said photoresist features of said at least one grating structure using oxygen as an etchant gas for a duration of approximately 10–40 seconds to reduce said photoresist features to a second size that is less than said first size.

8. The method of claim 1, wherein measuring light reflected off of said grating structure after said etching process is started to generate an optical characteristic trace for said grating structure comprises measuring a phase and intensity of spectroscopic light reflected off of said grating structure during said etching process to generate an optical characteristic trace for said grating structure.

9. The method of claim 1, wherein measuring light reflected off of said grating structure after said etching process is started to generate an optical characteristic trace for said grating structure comprises measuring a phase and intensity of spectroscopic light reflected off of said grating structure at a plurality of different times after said etching process is started to generate an optical characteristic trace for said grating structure during each said measurement.

10. The method of claim 9, further comprising comparing at least some of said generated optical characteristic traces to a target optical characteristic trace that corresponds to a grating structure comprised of a plurality of photoresist features having a desired profile.

11. The method of claim 10, further comprising stopping said etching process based upon said comparison of said at least some generated traces and said target trace.

12. The method of claim 1, wherein comparing said generated optical characteristic trace to a target optical characteristic trace that corresponds to a grating structure comprised of a plurality of photoresist features having a desired profile comprises comparing said generated optical characteristic trace to a target optical characteristic trace that corresponds to a grating structure comprised of a plurality of photoresist features having a desired profile comprised of a desired critical dimension.

13. The method of claim 1, wherein comparing said generated optical characteristic trace to a target optical characteristic trace that corresponds to a grating structure comprised of a plurality of photoresist features having a desired profile is performed in a scatterometry tool.

14. The method of claim 1, wherein comparing said generated optical characteristic trace to a target optical characteristic trace that corresponds to a grating structure comprised of a plurality of photoresist features having a desired profile comprises stopping said etching process when said generated trace and said target trace match.

15. The method of claim 1, further comprising performing an etching process on a process layer positioned beneath said grating structure after said etching process performed on said photoresist features is stopped.

16. A method, comprising:
forming at least one grating structure in a layer of photoresist material, said grating structure being comprised of a plurality of photoresist features of a first size;
performing an etching process on said photoresist features of said at least one grating structure to reduce said photoresist features to a second size that is less than said first size;
illuminating the at least one grating structure;
measuring light reflected off of said grating structure during said etching process to generate an optical characteristic trace for said grating structure;
comparing said generated optical characteristic trace to a target optical characteristic trace that corresponds to a grating structure comprised of a plurality of photoresist features having a desired profile; and
stopping said etching process based upon said comparison of said generated trace and said target trace.

17. The method of claim 16, wherein forming at least one grating structure in a layer of photoresist material, said grating structure being comprised of a plurality of photoresist features of a first size, comprises forming at least one grating structure in a layer of photoresist material above a scribe line of a wafer, said grating structure being comprised of a plurality of photoresist features of a first size.

18. The method of claim 16, wherein forming at least one grating structure in a layer of photoresist material, said grating structure being comprised of a plurality of photoresist features of a first size, comprises forming at least one grating structure in a layer of photoresist material above a production die of a wafer, said grating structure being comprised of a plurality of photoresist features of a first size.

19. The method of claim 16, wherein each of said grating structures occupies an area of approximately 100 $\mu$m×120 $\mu$m.

20. The method of claim 16, wherein said plurality of photoresist features comprising said at least one grating structure have a pitch ranging from approximately 400–1000 nm.

21. The method of claim 16, wherein performing an etching process on said photoresist features of said at least one grating structure to reduce said photoresist features to a second size that is less than said first size comprises performing an etching process on said photoresist features of said at least one grating structure using oxygen as an etchant gas to reduce said photoresist features to a second size that is less than said first size.

22. The method of claim 16, wherein performing an etching process on said photoresist features of said at least one grating structure to reduce said photoresist features to a second size that is less than said first size comprises performing an etching process on said photoresist features of said at least one grating structure using oxygen as an etchant gas for a duration of approximately 10–40 seconds to reduce said photoresist features to a second size that is less than said first size.

23. The method of claim 16, wherein measuring light reflected off of said grating structure during said etching process to generate an optical characteristic trace for said grating structure comprises measuring light reflected off of said grating structure at a plurality of different times during said etching process to generate an optical characteristic trace for said grating structure during each said measurement.

24. The method of claim 23, further comprising comparing at least some of said generated optical characteristic traces to a target optical characteristic trace that corresponds to a grating structure comprised of a plurality of photoresist features having a desired profile.

25. The method of claim 24, further comprising stopping said etching process based upon said comparison of said at least some generated traces and said target trace.

26. The method of claim 16, wherein comparing said generated optical characteristic trace to a target optical characteristic trace that corresponds to a grating structure comprised of a plurality of photoresist features having a desired profile comprises comparing said generated optical characteristic trace to a target optical characteristic trace that corresponds to a grating structure comprised of a plurality of photoresist features having a desired profile comprised of a desired critical dimension.

27. The method of claim 16, wherein comparing said generated optical characteristic trace to a target optical characteristic trace that corresponds to a grating structure comprised of a plurality of photoresist features having a desired profile is performed in a scatterometry tool.

28. The method of claim 16, wherein comparing said generated optical characteristic trace to a target optical characteristic trace that corresponds to a grating structure comprised of a plurality of photoresist features having a desired profile comprises stopping said etching process when said generated trace and said target trace match.

29. The method of claim 16, further comprising performing an etching process on a process layer positioned beneath said grating structure after said etching process performed on said photoresist features is stopped.

30. A method, comprising:
forming a plurality of grating structures in a layer of photoresist material, each of said grating structures being comprised of a plurality of photoresist features of a first size;
performing an etching process on said photoresist features of each of said plurality of grating structures to reduce said photoresist features to a second size that is less than said first size;
illuminating said plurality of grating structures;
measuring light reflected off of each of said plurality of grating structures after said etching process is started to generate an optical characteristic trace for each of said plurality of grating structures;
comparing a plurality of said generated optical characteristic traces to a target optical characteristic trace that corresponds to a grating structure comprised of a plurality of photoresist features having a desired profile; and stopping said etching process based upon said comparison of at least one of said generated traces and said target trace.

31. The method of claim 30, wherein forming a plurality of grating structures in a layer of photoresist material, each of said plurality of grating structures being comprised of a plurality of photoresist features of a first size, comprises forming a plurality of grating structures in a layer of photoresist material above a scribe line of a wafer, each of said plurality of grating structures being comprised of a plurality of photoresist features of a first size.

32. The method of claim 30, wherein forming a plurality of grating structures in a layer of photoresist material, each of said plurality of grating structures being comprised of a plurality of photoresist features of a first size, comprises forming a plurality of grating structures in a layer of photoresist material above a production die of a wafer, each of said plurality of grating structures being comprised of a plurality of photoresist features of a first size.

33. The method of claim 30, wherein each of said grating structures occupies an area of approximately 100 $\mu$m×120 $\mu$m.

34. The method of claim 30, wherein said plurality of photoresist features comprising each of said plurality of grating structures have a pitch ranging from approximately 400–1000 nm.

35. The method of claim 30, wherein performing an etching process on said photoresist features of each of said plurality of grating structures to reduce said photoresist features to a second size that is less than said first size comprises performing an etching process on said photoresist features of each of said plurality of grating structures using oxygen as an etchant gas to reduce said photoresist features to a second size that is less than said first size.

36. The method of claim 30, wherein performing an etching process on said photoresist features of each of said plurality of grating structures to reduce said photoresist features to a second size that is less than said first size comprises performing an etching process on said photoresist features of each of said plurality of grating structures using oxygen as an etchant gas for a duration of approximately 10–40 seconds to reduce said photoresist features to a second size that is less than said first size.

37. The method of claim 30, wherein measuring light reflected off of each of said plurality of grating structures after said etching process is started to generate an optical characteristic trace for each of said plurality of grating structures comprises measuring a phase and intensity of spectroscopic light reflected off of each of said plurality of grating structures during said etching process to generate an optical characteristic trace for each of said plurality of grating structures.

38. The method of claim 30, wherein measuring light reflected off of each of said plurality of grating structures after said etching process is started to generate an optical characteristic trace for each of said plurality of grating structures comprises measuring a phase and intensity of spectroscopic light reflected off of each of said plurality of grating structures at a plurality of different times after said etching process is started to generate an optical characteristic trace for each of said plurality of grating structures during each said measurement.

39. The method of claim 38, further comprising comparing at least some of said generated optical characteristic traces to a target optical characteristic trace that corresponds to a grating structure comprised of a plurality of photoresist features having a desired profile.

40. The method of claim 39, further comprising stopping said etching process based upon said comparison of said at least some generated traces and said target trace.

41. The method of claim 30, wherein comparing a plurality of said generated optical characteristic traces to a target optical characteristic trace that corresponds to a grating structure comprised of a plurality of photoresist features having a desired profile comprises comparing a plurality of said generated optical characteristic traces to a target optical characteristic trace that corresponds to a grating structure comprised of a plurality of photoresist features having a desired profile comprised of a desired critical dimension.

42. The method of claim 30, wherein comparing said plurality of said generated optical characteristic traces to a target optical characteristic trace that corresponds to a grating structure comprised of a plurality of photoresist features having a desired profile is performed in a scatterometry tool.

43. The method of claim 30, wherein comparing said plurality of said generated optical characteristic traces to a target optical characteristic trace that corresponds to a grating structure comprised of a plurality of photoresist features having a desired profile comprises stopping said etching process when at least one of said generated traces and said target trace match.

44. The method of claim 30, further comprising performing an etching process on a process layer positioned beneath said grating structure after said etching process performed on said photoresist features is stopped.

45. A method, comprising:
forming a process layer above a semiconducting substrate;
forming a layer of photoresist material above said process layer;
forming a plurality of photoresist features of a first size in said layer of photoresist material, a first group of said photoresist features comprising at least one grating structure;
performing an etching process on said plurality of photoresist features to reduce said photoresist features to a second size, said second size being less than said first size;
illuminating said at least one grating structure;
measuring light reflected off of said at least one grating structure after said etching process is started to generate an optical characteristic trace for said grating structure;
comparing said generated optical characteristic trace to a target optical characteristic trace that corresponds to a grating structure comprised of a plurality of photoresist features having a desired profile; and
stopping said etching process based upon said comparison of said generated trace and said target trace.

46. The method of claim 45, wherein forming a process layer above a semiconducting substrate comprises forming a process layer comprised of polysilicon above a semiconducting substrate.

47. The method of claim 45, wherein forming a layer of photoresist material above said process layer comprises forming a layer of positive photoresist material above said process layer.

48. The method of claim 45, wherein forming a layer of photoresist material above said process layer comprises forming a layer of negative photoresist material above said process layer.

49. The method of claim 45, wherein said grating structure is formed above a scribe line of a wafer.

50. The method of claim 45, wherein said grating structure is formed above a production die of a wafer.

51. The method of claim 45, wherein each of said grating structures occupies an area of approximately 100 μm×120 μm.

52. The method of claim 45, wherein said plurality of photoresist features comprising said at least one grating structure have a pitch ranging from approximately 400–1000 nm.

53. The method of claim 45, wherein performing an etching process on said plurality of photoresist features to reduce said photoresist features to a second size that is less than said first size comprises performing an etching process on said plurality of photoresist features using oxygen as an etchant gas to reduce said photoresist features to a second size that is less than said first size.

54. The method of claim 45, wherein performing an etching process on said plurality of photoresist features to reduce said photoresist features to a second size that is less than said first size comprises performing an etching process on said plurality of photoresist features using oxygen as an etchant gas for a duration of approximately 10–40 seconds to reduce said photoresist features to a second size that is less than said first size.

55. The method of claim 45, wherein measuring light reflected off of said grating structure after said etching process is started to generate an optical characteristic trace for said grating structure comprises measuring light reflected off of said grating structure during said etching process to generate an optical characteristic trace for said grating structure.

56. The method of claim 45, wherein measuring light reflected off of said grating structure after said etching process is started to generate an optical characteristic trace for said grating structure comprises measuring light reflected off of said grating structure at a plurality of different times after said etching process is started to generate an optical characteristic trace for said grating structure during each said measurement.

57. The method of claim 56, further comprising comparing at least some of said generated optical characteristic traces to a target optical characteristic trace that corresponds to a grating structure comprised of a plurality of photoresist features having a desired profile.

58. The method of claim 57, further comprising stopping said etching process based upon said comparison of said at least some generated traces and said target trace.

59. The method of claim 45, wherein comparing said generated optical characteristic trace to a target optical characteristic trace that corresponds to a grating structure comprised of a plurality of photoresist features having a desired profile comprises comparing said generated optical characteristic trace to a target optical characteristic trace that corresponds to a grating structure comprised of a plurality of photoresist features having a desired profile comprised of a desired critical dimension.

60. The method of claim 45, wherein comparing said generated optical characteristic trace to a target optical characteristic trace that corresponds to a grating structure comprised of a plurality of photoresist features having a desired profile is performed in a scatterometry tool.

61. The method of claim 45, wherein comparing said generated optical characteristic trace to a target optical characteristic trace that corresponds to a grating structure comprised of a plurality of photoresist features having a desired profile comprises stopping said etching process when said generated trace and said target trace match.

62. The method of claim 45, further comprising performing an etching process on process layer positioned beneath said grating structure after said etching process performed on said photoresist features is stopped.

63. A method, comprising:
   forming a process layer above a semiconducting substrate;
   forming a layer of photoresist material above said process layer;
   forming a plurality of photoresist features of a first size in said layer of photoresist material to thereby define at least one plurality of grating structures, each of which are comprised of a plurality of said photoresist features;
   performing an etching process on said plurality of photoresist features to reduce said photoresist features to a second size, said second size being less than said first size;
   illuminating a plurality of said grating structures;
   measuring light reflected off of said grating structures after said etching process is started to generate an optical characteristic trace for each of said illuminated grating structures;
   comparing each of a plurality of said generated optical characteristic traces to a target optical characteristic trace that corresponds to a grating structure comprised of a plurality of photoresist features having a desired profile; and
   stopping said etching process based upon said comparison of said generated traces and said target trace.

64. The method of claim 63, wherein forming a process layer above a semiconducting substrate comprises forming a process layer comprised of polysilicon above a semiconducting substrate.

65. The method of claim 63, wherein forming a layer of photoresist material above said process layer comprises forming a layer of positive photoresist material above said process layer.

66. The method of claim 63, wherein forming a layer of photoresist material above said process layer comprises forming a layer of negative photoresist material above said process layer.

67. The method of claim 63, wherein at least some of said plurality of grating structures are formed above a scribe line of a wafer.

68. The method of claim 63, wherein at least some of said plurality of grating structures are formed above a production die of a wafer.

69. The method of claim 63, wherein each of said grating structures occupies an area of approximately 100 μm×120 μm.

70. The method of claim 63, wherein said plurality of photoresist features comprising each of said grating structures have a pitch ranging from approximately 400–1000 nm.

71. The method of claim 63, wherein performing an etching process on said photoresist features of said at least one grating structure to reduce said photoresist features to a second size that is less than said first size comprises performing an etching process on said photoresist features of said at least one grating structure using oxygen as an etchant gas to reduce said photoresist features to a second size that is less than said first size.

72. The method of claim 63, wherein performing an etching process on said photoresist features of said at least one grating structure to reduce said photoresist features to a second size that is less than said first size comprises performing an etching process on said photoresist features of said at least one grating structure using oxygen as an etchant gas for a duration of approximately 10–40 seconds to reduce said photoresist features to a second size that is less than said first size.

73. The method of claim 63, wherein measuring light reflected off of said grating structures after said etching process is started to generate an optical characteristic trace for each of said grating structures comprises measuring light reflected off of each of said grating structures during said etching process to generate an optical characteristic trace for each of said grating structures.

74. The method of claim 63, wherein measuring light reflected off of said grating structures after said etching process is started to generate an optical characteristic trace for each of said grating structures comprises measuring light reflected off of each of said grating structures at a plurality of different times after said etching process is started to generate an optical characteristic trace for each of said grating structures during each said measurement.

75. The method of claim 74, further comprising comparing at least some of said generated optical characteristic traces to a target optical characteristic trace that corresponds to a grating structure comprised of a plurality of photoresist features having a desired profile.

76. The method of claim 75, further comprising stopping said etching process based upon said comparison of said at least some of said generated traces and said target trace.

77. The method of claim 63, wherein comparing each of a plurality of said generated optical characteristic traces to a target optical characteristic trace that corresponds to a grating structure comprised of a plurality of photoresist features having a desired profile comprises comparing each of a plurality of said generated optical characteristic traces to a target optical characteristic trace that corresponds to a grating structure comprised of a plurality of photoresist features having a desired profile comprised of a desired critical dimension.

78. The method of claim 63, wherein comparing each of a plurality of said generated optical characteristic traces to a target optical characteristic trace that corresponds to a grating structure comprised of a plurality of photoresist features having a desired profile is performed in a scatterometry tool.

79. The method of claim 63, wherein comparing each of a plurality of said generated optical characteristic traces to a target optical characteristic trace that corresponds to a grating structure comprised of a plurality of photoresist features having a desired profile comprises stopping said etching process when at least some of said generated traces and said target trace match.

80. The method of claim 63, further comprising performing an etching process on a process layer positioned beneath said grating structure after said etching process performed on said photoresist features is stopped.

* * * * *

UNITED STATES PATENT AND TRADEMARK OFFICE
CERTIFICATE OF CORRECTION

PATENT NO. : 6,707,562 B1
DATED : March 16, 2004
INVENTOR(S) : Kevin R. Lensing

It is certified that error appears in the above-identified patent and that said Letters Patent is hereby corrected as shown below:

<u>Column 15,</u>
Line 67, before "process layer" insert -- a --.

Signed and Sealed this

Seventh Day of September, 2004

JON W. DUDAS
*Director of the United States Patent and Trademark Office*